United States Patent
Lee et al.

(10) Patent No.: US 11,283,155 B2
(45) Date of Patent: Mar. 22, 2022

(54) MULTIBAND ANTENNA AND ELECTRONIC DEVICE INCLUDING THE SAME

(71) Applicant: Samsung Electronics Co., Ltd., Suwon-si (KR)

(72) Inventors: Junho Lee, Suwon-si (KR); Hyunho Baek, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 16/440,058

(22) Filed: Jun. 13, 2019

(65) Prior Publication Data

US 2019/0386378 A1    Dec. 19, 2019

(30) Foreign Application Priority Data

Jun. 15, 2018 (KR) .................. 10-2018-0069262

(51) Int. Cl.
*H01Q 1/24* (2006.01)
*H01Q 5/30* (2015.01)
(Continued)

(52) U.S. Cl.
CPC ........... *H01Q 1/243* (2013.01); *H01L 23/147* (2013.01); *H01L 23/481* (2013.01);
(Continued)

(58) Field of Classification Search
CPC ........ H01Q 1/2283; H01Q 1/243; H01Q 1/50; H01Q 5/30; H01Q 5/321; H01Q 5/42;
(Continued)

(56) References Cited

U.S. PATENT DOCUMENTS

| | | | |
|---|---|---|---|
| 9,779,990 | B2 | 10/2017 | Huang et al. |
| 2008/0158069 | A1 | 7/2008 | Mateus Mendes et al. |

(Continued)

FOREIGN PATENT DOCUMENTS

| | | | |
|---|---|---|---|
| JP | 4161075 B2 | | 8/2008 |
| KR | 10-2012-0027588 A | | 3/2012 |
| KR | 10-2012-0074588 A | | 7/2012 |

OTHER PUBLICATIONS

Song Yexi et al: "An On-Chip Frequency-Reconfigurable Antenna For Q-Band Broadband Applications", IEEE Antennas and Wireless Propagation Letters, vol. 16, May 31, 2017 (May 31, 2017), pp. 2232-2235, XP011658575, ISSN: 1536-1225, DOI: 10.1109/LAWP. 2017.2709911 [retrieved on Aug. 7, 2017] * p. 2232-p. 2235; figure 1 *.

(Continued)

*Primary Examiner* — Robert Karacsony
(74) *Attorney, Agent, or Firm* — Jefferson IP Law, LLP

(57) ABSTRACT

An electronic device and an antenna device of an electronic device are provided. The electronic device includes a wafer, a radio frequency integrated circuit (RFIC) fabricated in the wafer, an antenna interposer disposed on a surface of the wafer, an antenna structure fabricated in the antenna interposer, the antenna structure comprising a first conductive pattern with a first electrical length and a second conductive pattern with a second electrical length, a switch formed in the RFIC and electrically connected to at least one of the first conductive pattern or the second conductive pattern based on a frequency band of a signal being transmitted or received by the RFIC, and a through hole formed in at least part of the wafer or the antenna interposer and electrically connecting the RFIC and the antenna structure.

18 Claims, 12 Drawing Sheets

(51) Int. Cl.

| | |
|---|---|
| *H01L 23/14* | (2006.01) |
| *H01L 23/48* | (2006.01) |
| *H01L 23/498* | (2006.01) |
| *H01L 23/66* | (2006.01) |
| *H01Q 1/22* | (2006.01) |
| *H01Q 23/00* | (2006.01) |
| *H01Q 21/08* | (2006.01) |
| *H01Q 5/42* | (2015.01) |

(52) U.S. Cl.
CPC .. *H01L 23/49827* (2013.01); *H01L 23/49838* (2013.01); *H01L 23/66* (2013.01); *H01Q 1/2283* (2013.01); *H01Q 5/30* (2015.01); *H01Q 5/42* (2015.01); *H01Q 21/08* (2013.01); *H01Q 23/00* (2013.01); *H01L 2223/6677* (2013.01)

(58) Field of Classification Search
CPC ........ H01Q 9/14; H01Q 9/0442; H01Q 21/08; H01Q 23/00; H01L 23/66; H01L 23/147; H01L 23/15; H01L 23/481; H01L 23/49827; H01L 23/49838; H01L 2223/6677
See application file for complete search history.

(56) References Cited

U.S. PATENT DOCUMENTS

| | | | |
|---|---|---|---|
| 2012/0162035 A1 | 6/2012 | Jung et al. | |
| 2013/0249109 A1 | 9/2013 | Ma et al. | |
| 2014/0035097 A1 | 2/2014 | Lin et al. | |
| 2014/0152512 A1 | 6/2014 | Yen et al. | |
| 2014/0235183 A1* | 8/2014 | Zhao | H01L 23/49816 455/77 |
| 2015/0340765 A1 | 11/2015 | Dang et al. | |

OTHER PUBLICATIONS

Bouayadi Ossama El et al: "Silicon interposer: A versatile platform towards full-3D integration of wireless systems at millimeter-wave frequencies", 2015 IEEE 65th Electronic Components and Technology Conference (ECTC), IEEE, May 29, 2015 (May 29, 2015), pp. 973-980, XP033175177, DOI: 10.1109/ECTC.2015.7159713 [retrieved on Jul. 15, 2015] * figure 1; table 1 *.

Mai O Sallam et al.: "Reconfigurable micromachined on-chip antenna with radiation pattern diversity", Antennas and Propagation (EUCAP), 2013 7th European Conference On, IEEE, Apr. 12, 2013 (Apr. 12, 2013), pp. 1581-1585, XP032430308, ISBN: 978-1-4673-2187-7 * p. 1581-p. 1585; figure 4.

Yiming Huo et al: "5G Cellular User Equipment: From Theory to Practical Hardware Design", arxiv.org, Cornell University Library, 201 Olin Library Cornell University Ithaca, NY 14853, Jul. 18, 2017 (Jul. 18, 2017), XP080761680, DOI: 10.1109/ACCESS.2017.2727550 * section III.C; figure 7.

International Search Report dated Sep. 20, 2019, issued in International Patent Application No. PCT/KR2019/007132.

European Search Report dated Nov. 21, 2019, issued in European Patent Application No. 19180388.1.

European Examination Report dated Feb. 25, 2021; European Appln. No. 19 180 388.1-1205.

* cited by examiner

MULTIBAND ANTENNA AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2018-0069262, filed on Jun. 15, 2018, in the Korean Intellectual Property Office, the disclosure of which is incorporated by reference herein in its entirety.

BACKGROUND

1. Field

The disclosure relates to antenna structures for supporting multiple bands in an electronic device.

2. Description of Related Art

With the diversification of communication services, it is becoming common for a service provider to be assigned and use multiple frequency bands that facilitate providing various services in a frequency band-specific manner.

In line with this trend, electronic devices are being equipped with an antenna capable of covering multiple service-specific bands of the service providers. For example, an electronic device may be implemented with a multiband antenna operating in two or more frequency bands.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below.

A multiband integrated antenna is implemented as a single integrated antenna using an interposer (or wafer) of a communication module and a through silicon via (TSV) according to the related art. For example, the multiband integrated antenna of the related art is implemented in such a way of disposing an on-chip group plane for the purpose of emitting and reflecting an electromagnetic field, another on-chip group plane on a top surface of an interposer to secure a sufficient ground plane of the antenna using a TSV, and an off-chip ground plane connected via a printed circuit board (PCB) below.

However, the multiband integrated antenna structure of the related art may be implemented by integrating only a single antenna. For example, in a 5$^{th}$ generation (5G) communication system operating in millimeter wave (mmWave) frequency bands for supporting multiband communications, the lack of multiband communication supportability with a single antenna makes it necessary to have a new integrated antenna for supporting multiband communication. For example, the technology of the related art allows only use of a band dedicated to a single antenna.

Meanwhile, future communication systems are to be designed for supporting communications in both the frequency band in use by legacy systems and the mmWave frequency band (e.g. 30 gigahertz (GHz)~300 GHz bands), which require technologies for making it possible to support multiband communication, if necessary, as well as single band communication.

Additional aspects will be set forth in part in the description which follows and, in part, will be apparent from the description, or may be learned by practice of the presented embodiments.

In accordance with an aspect of the disclosure, an electronic device is provided. The electronic device includes an antenna device implemented in the form of an on-chip multiband integrated antenna using an antenna switch for supporting multiband communication.

In accordance with another aspect of the disclosure, an electronic device is provided. The electronic device includes a wafer, a radio frequency integrated circuit (RFIC) fabricated on the wafer, an antenna interposer disposed on a surface of the wafer, an antenna structure fabricated in the antenna interposer and including a first conductive pattern with a first electrical length and a second conductive pattern with a second electrical length, a switch formed in the RFIC and electrically connecting to at least one of the first conductive pattern or the second conductive pattern based on a frequency band of a signal transmitted or received by the RFIC, and a through hole formed in at least part of the wafer or the antenna interposer and electrically connecting the RFIC and the antenna structure.

In accordance with another aspect of the disclosure, an antenna device of an electronic device is provided. The antenna device includes a wafer including a plurality of first metal layers, an antenna interposer disposed on one surface of the wafer and including a plurality of second metal layers, an RFIC fabricated in at least part of the first multiple metal layers, an antenna structure fabricated in at least part of the second multiple layers and including a first conductive pattern with a first electrical length and a second conductive pattern with a second electrical length, a switch fabricated in the RFIC and having one end electrically connected to the first conductive pattern and another end electrically connected to the second conductive pattern, and establishing an electrical connection to at least one of the first conductive pattern or the second conductive pattern based on a frequency band in use by the RFIC, and a through hole forming an electrical connection path between the wafer and the antenna interposer.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
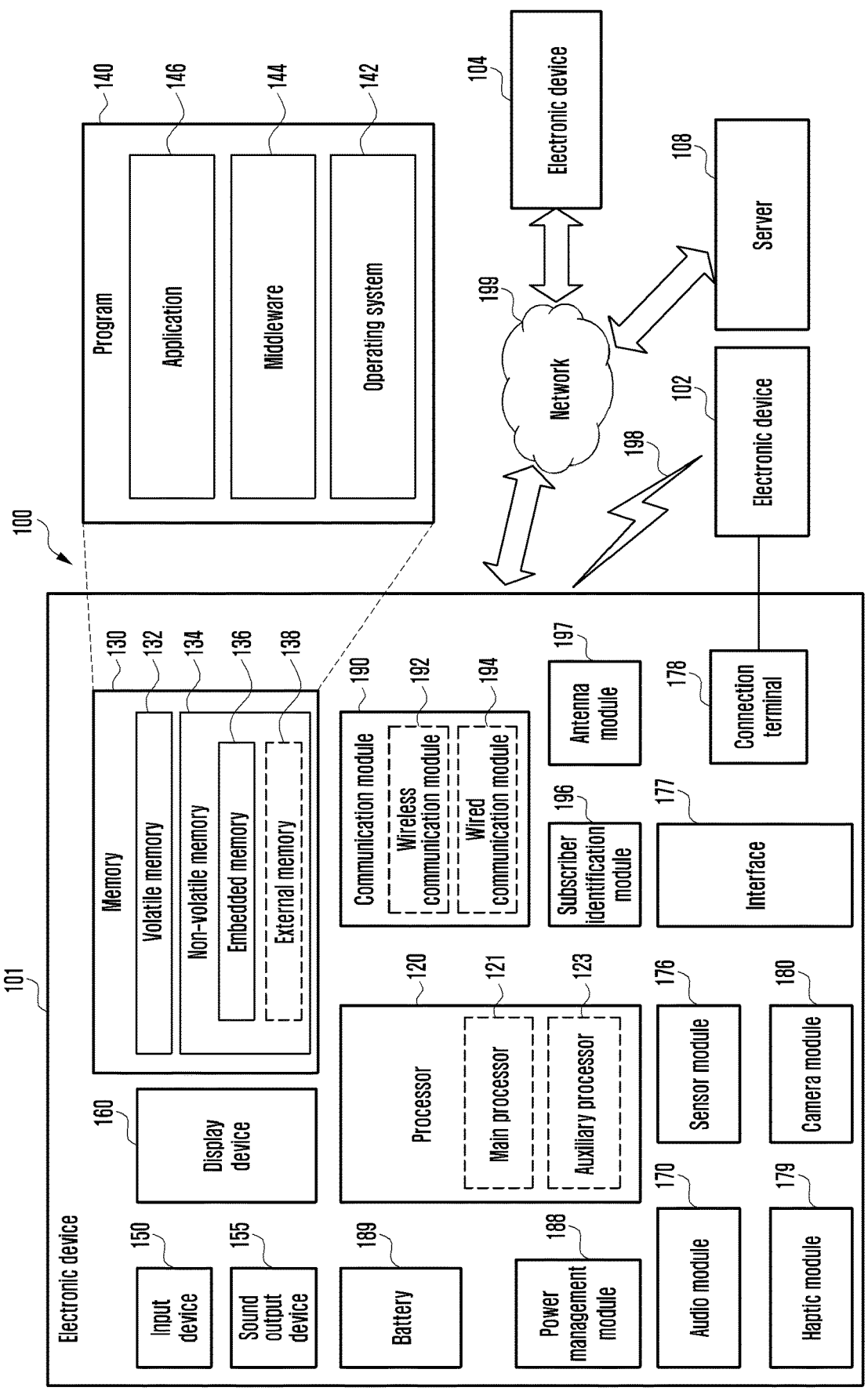
FIG. 1 is a block diagram illustrating an electronic device in a network according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of, the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). According to an embodiment, the connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or IR data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101.

According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
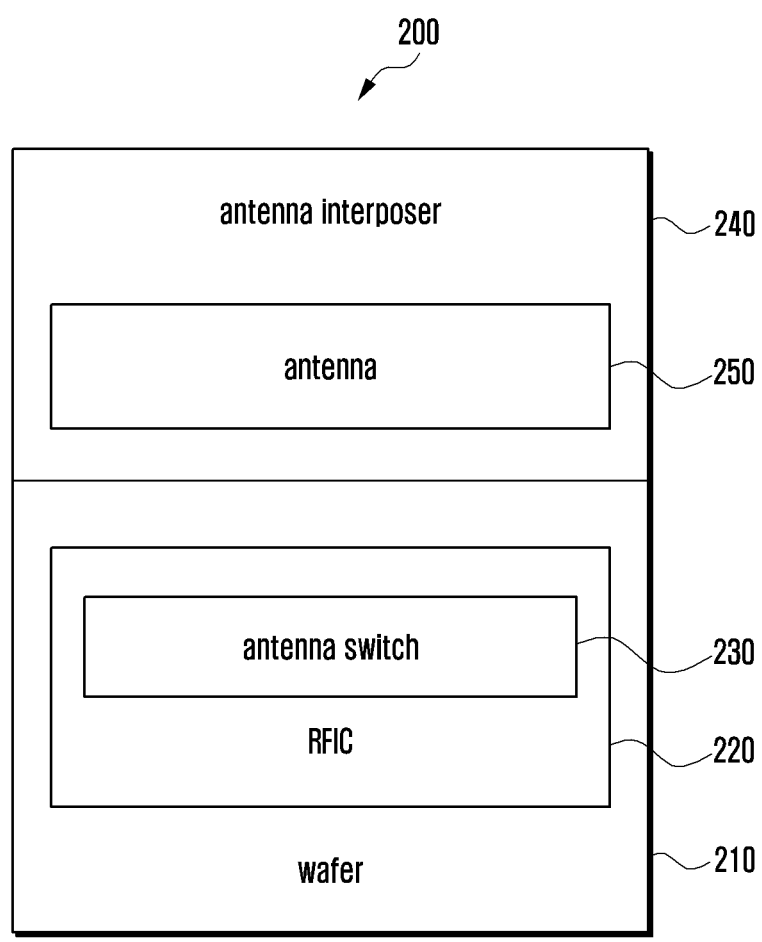
FIG. 2 is a schematic diagram illustrating a structure of an on-chip multiband antenna according to an embodiment of the disclosure.

FIG. 2 is a schematic diagram illustrating a structure of an on-chip multiband antenna according to an embodiment of the disclosure.

Referring to FIG. 2, a communication chipset 200 may include a wafer 210 (or semiconductor wafer) and an antenna interposer 240 (e.g., silicon (Si) interposer) or a glass interposer. According to various embodiments, the communication chipset 200 may include an RFIC 220 formed on the wafer 210 and an antenna structure 250 fabricated on the antenna interposer 240. According to various embodiments, the wafer 210 and the antenna interposer 240 may be laminated such that a surface of a top side (or top surface) of the wafer 210 and a surface of a bottom side (or bottom surface) of the antenna interposer 240 face each other.

Although the wafer 210 and the RFIC 220 are described separately, the wafer 210 may be expressed as a single component integrating the wafer 210 as a semiconductor material and the RFIC 220 in various embodiments.

According to various embodiments, the communication chipset 200 may include an antenna switch 230 for switching between multiple bands (or between per-band antennas) (hereinafter, referred to as "antenna switch"). According to an embodiment, the antenna switch 230 may be implemented with, but not limited to, a metal oxide semiconductor field effect transistor (MOSFET) switch, a metal-semiconductor field-effect transistor (MEFET), or a metal-insulator-semiconductor field-effect transistor (MISFET). According to various embodiments, the antenna switch 230 may be integrated into the RFIC 220.

According to various embodiments, the communication chipset 200 may be implemented in an on-chip manner by fully integrating the antenna structure 250 through the RFIC 220 including the antenna switch 230 or the antenna structure 250.

According to an embodiment, the RFIC 220 including the antenna switch 230 may be implemented as a fully-integrated system-on-chip in such a way of being formed on a specific layer (e.g., front-end to back-end metal layer) of the wafer 210 through a silicon process, disposing the antenna interposer as a passive structure on the top surface of the wafer 210, and forming the antenna structure 250 on the metal layer in the antenna interposer 240.

According to various embodiments, it may be possible select multiple bands with an antenna structure using the antenna switch 230 and select per-band antenna operations of the antenna structure 250 implemented in the antenna interposer 240. For example, it may be possible to select the antenna structure according to a necessary band (e.g., to select an antenna node (e.g., conductive pattern) to have an antenna length according to the band) using the antenna switch 230.

According to various embodiments, the communication chipset 200 may include a through hole (e.g., through silicon via (TSV)) for exchanging signals between the wafer 210 and the antenna interposer 240 or a TSV. According to an embodiment, the TSV may be fabricated in such a way of forming a fine hole (or via) penetrating the wafer 210 and the antenna interposer 240 and filling the fine hole with conductive martials to secure an electrical connection path. According to various embodiments, the antenna switch 230 fabricated on the wafer 210 as part of the RFIC 220 may be electrically connected to the antenna structure 250 formed in the antenna interposer through the through hole.

According to various embodiments, two types of TSVs may be applied. For example, the TSVs may include, but are not limited to, a first TSV (e.g., feeding TSV) (not shown) for exchanging signals for feeding between the RFIC 220 and the antenna structure 250 and a second TSV (e.g., an ANT TSV) (not shown) for selecting an antenna according to a band necessary between the antenna switch 230 and the antenna structure 250.

According to various embodiments, the types of the antenna structure 250 may include a patch antenna, a dipole antenna, a folded antenna, and an array antenna, by way of example. According to various embodiments, the antenna interposer 240 may be implemented with various materials such as silicon and glass.

Figure 3:
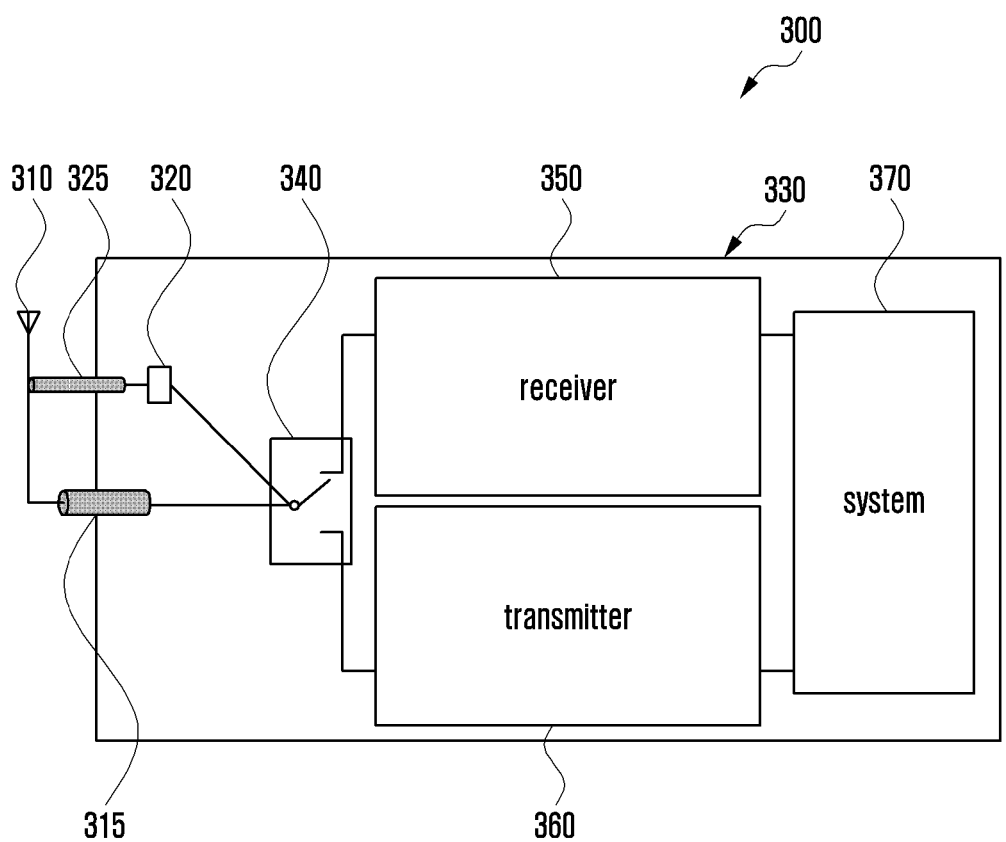
FIG. 3 is a diagram illustrating a communication chipset including a multiband on-chip antenna for an electronic device according to an embodiment of the disclosure.

FIG. 3 is a diagram illustrating a communication chipset including a multiband on-chip antenna for an electronic device according to an embodiment of the disclosure.

In a mobile communication system operating below 6 gigahertz (GHz), transmission capacity is by bandwidth restriction. In order to overcome this, research has been conducted recently on next generation mobile communication radio frequency (RF) technologies for use of mmWave frequencies that facilitate securing a broad bandwidth; the electronic device 101 according to various embodiments may include a communication chipset 300 (e.g., communication module 190 and antenna module 197 in FIG. 1) to support such technologies.

Referring to FIG. 3, a structure of a communication chipset for supporting multiple bands with an antenna structure 310 in frequency bands above 3 GHz such as mmWave is shown. According to various embodiments, the communication chipset 300 may be implemented to have a multiband on-chip antenna with an antenna switch 320.

In reference to FIG. 3, the communication chipset 300 may include an antenna structure 310, an antenna switch 320 (e.g., MOSFET switch), and an RFIC 330. According to an embodiment, the communication chipset 300 may include a system for processing a signal to be transmitted to the outside (e.g., to another electronic device) and a signal received from the outside. According to an embodiment, the system 370 may include a chip operating on a low frequency (LF) (e.g., 30-300 KHz) chip. According to various embodiments, the antenna switch 320 may be included in an RFIC 330. According to various embodiments, the antenna structure 310 and the antenna switch 320 may be integrally expressed as a multiband integrated antenna, and the multiband integrated antenna implemented on a chip may be expressed as a multiband on-chip antenna.

According to various embodiments, the antenna structure 310 may include the whole or part of the antenna module 197 of FIG. 1. According to various embodiments, the antenna structure 310 may be implemented, by way of example, with a patch antenna, a dipole antenna, a folded antenna, or an array antenna with a plurality of antenna elements. According to various embodiments, the antenna structure 310 may work, by way of example, as an antenna operating in a first band (e.g., 39 GHz frequency spectrum) or as an antenna operating in a second band (e.g., 28 GHz frequency spectrum). According to various embodiments, the antenna structure 310 may be implemented, by way of example, in an interposer (e.g., antenna interposer 240 in FIG. 2) as a multiband integrated antenna. According to various embodiments, the antenna structure 310 may communicate signals with the RFIC 330 through the first TSV 315. How the antenna structure 310 is implemented in an interposer (e.g., antenna interposer 240 in FIG. 2) is described later with reference to FIG. 4.

According to various embodiments, the antenna switch 320 may be a switch for selecting a band-specific operation of the antenna structure 310 (e.g., antenna operation for a first band or an antenna operation for a second band). According to an embodiment, the antenna switch 320 may be implemented as, but not limited to, a MOSFET switch. According to various embodiments, the antenna switch 320 may be included in the RFIC 330 fabricated on a wafer (e.g., wafer 210 in FIG. 2). According to various embodiments, the antenna switch 320 may be electrically connected to or disconnected from the antenna structure 310 through the second TSV 325 (e.g., ANT TSV). How the antenna switch 320 is implemented in the wafer (e.g., wafer 210 in FIG. 2) is described later with reference to FIG. 4.

According to various embodiments, the RFIC 330 may include a switch 340 (e.g., a transmit (Tx)/receive (Rx) switch) for selecting a path for transmitting/receiving a signal and an RF transceiver (e.g., receiver 350 and transmitter 360) for supporting multiband communication and it may be implemented as a high-performance multifunctional IC for supporting two or more bands with a single chip.

According to an embodiment, the switch 340 may be implemented as a single pole double through (SPDT) switch by way of example. According to an embodiment, the switch 340 may connect the antenna structure 310 to one of a sending end (e.g., transmitter 360) and a receiving end (e.g., receiver 350) in a system operating in a time division duplex (TDD) mode.

According to an embodiment, although not shown in the drawing, the receiver 350 may include a filter, a low noise amplifier (LNA), a mixer, a buffer, and a voltage controlled oscillator (VCO). According to an embodiment, although not shown in the drawing, the transmitter 360 may include a filter, a power amplifier (PA), a drier, and a VCO.

According to an embodiment, the PA may be a high-efficiency PA infused with high power efficiency technologies for supporting mmWave such as doherty technology, envelope elimination and restoration (EER) technology, linear amplification using non-linear components (LINC) technology, Class-S PA technology, and envelop tracking (ET) technology. According to an embodiment, the LNA may remove noise at the receiving end through low noise matching. According to an embodiment, the filter of the receiving end (e.g., receiver 350) and the transmitter (e.g., transmitter 360) may pass signals in a system-desired frequency range (e.g., 28 GHz and 39 GHz) to remove unnecessary frequency signals. For example, the filter may be positioned at the input end of the PA of the transmitter and the output end of the LNA of the receiver to remove unnecessary signals. Because the configurations of the receiver 350 and transmitter 360 are well known in the art, detailed descriptions thereof are omitted herein.

According to various embodiments, a multiband antenna may be implemented at the on-chip level with an antenna switch 320 formed in the antenna structure operating in above 3 GHz frequency bands such as mmWave bands. Hereinafter, a description is made of the multiband on-chip antenna being implemented with a switch according to various embodiments.

Figure 4:
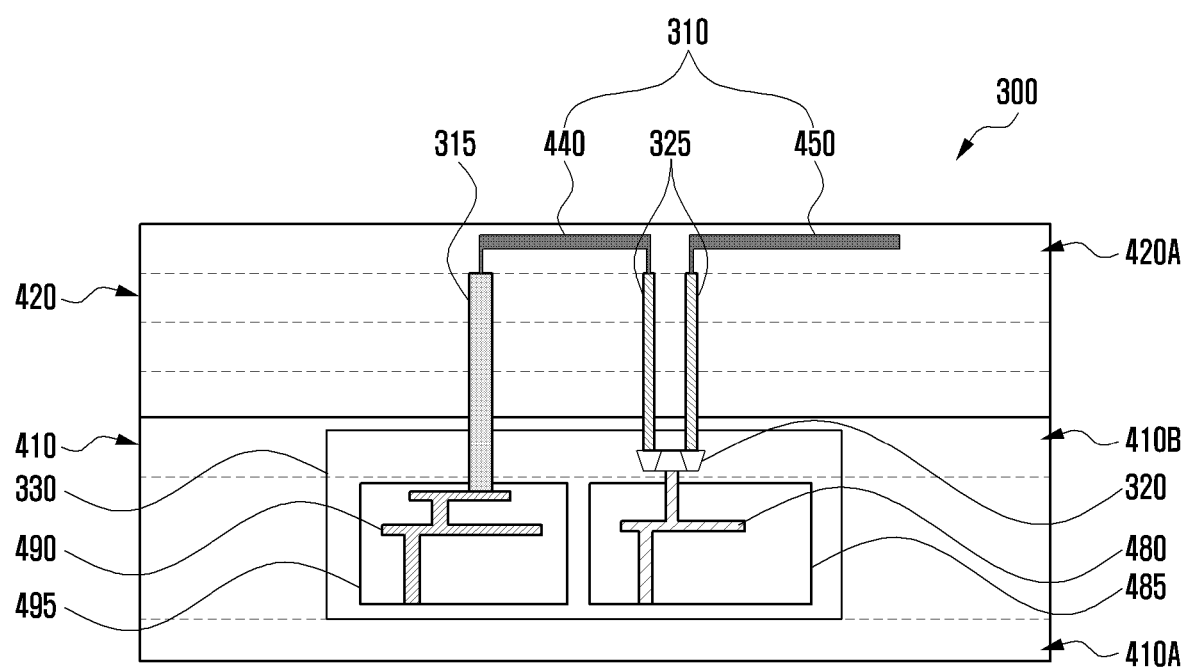
FIG. 4 is a cross-sectional view illustrating the multiband on-chip antenna of FIG. 3 according to an embodiment of the disclosure.

FIG. 4 is a cross-sectional view of a multiband on-chip antenna of FIG. 3 according to an embodiment of the disclosure.

Referring to FIG. 4, how the multiband integrated antenna including the antenna structure 310 and the antenna switch 320 is implemented (or designed) in the single chipset RFIC 330 of FIG. 3 in an on-chip manner for use in the electronic device 101 is shown.

In reference to FIGS. 3 and 4, the multiband on-chip antenna is implemented in the form of an RFIC 330 including the antenna switch 320 fabricated on a metal layer of a wafer 410 during a silicon process. Although the wafer 410 and the RFIC 330 are separated described, they may be formed as a single component because the wafer 410 is a material for fabricating an IC. According to various embodiments, the wafer 410 may include multiple metal layers. According to an embodiment, the RFIC 330 including the antenna switch 320 may be implemented in the wafer 410 using a front-end metal layer 410A or a back-end metal layer 410B among the multiple metal layers of the wafer 410.

According to various embodiments, an antenna interposer 420 may be bonded (or situated) on a surface of the wafer 410 (e.g. top surface of the wafer 410 as shown in FIG. 4). According to an embodiment, the antenna interposer 420 is stacked on the wafer 410 such that a surface of the wafer 410 and a surface of the antenna interposer 420 (bottom surface of the antenna interposer 420) are bonded face to face.

According to various embodiments, the antenna interposer 420 may include the antenna structure 310 supporting multiple bands (e.g., mmWave bands). According to an embodiment, the antenna structure 310 may be fabricated to have a first conductive pattern 440 and a second conductive pattern 450. According to various embodiments, the antenna interposer 420 may include multiple metal layers. According to various embodiments, the first and second conductive patterns 440 and 450 may be fabricated on a metal layer 420A (e.g., a topmost layer or outermost layer in the drawing). According to various embodiments, the multiband integrated antenna structure with the antenna switch 320 may be fabricated in a system on-chip manner as described above. According to an embodiment, the conductive patterns 440 and 450 of the antenna structure 310 may be implemented on part of a molding layer (not shown) disposed on one surface of the antenna interposer 420 (e.g., a top surface of the antenna interposer 420 in FIG. 4).

According to various embodiments, the RFIC 330 including the antenna switch 320 may be fabricated in such a way of disposing the front-end metal layer 410A and the back-end metal layer 410B on the wafer 410 and disposing a metal layer 420A on the antenna interposer 420 as a passive structure to fabricate the antenna structure 310 (e.g., first conductive pattern 440 and second conductive pattern 450) supporting multiple bands. According to various embodiments, the antenna switch 320 (e.g., a MOSFET switch) for switching between multiple bands may be fabricated in such a way of being electrically connected with the conductive patterns (e.g., first conductive pattern 440 and second conductive pattern 450) via the TSV (e.g., second TSV 325), the antenna switch 320, and the conductive patterns being fabricated on metal layers. According to various embodiments, the first conductive pattern 440 of the antenna structure 310 may be fabricated to have a first electric length, and the second conductive pattern 450 may be fabricated to have a second electric length that is identical with or different from the first electric length. According to an embodiment, the antenna switch 320 may electrically connect to at least one of the first and second conductive patterns 440 and 450 based on the frequency of a signal being transmitted or received by the RFIC 330.

According to various embodiments, the length (e.g., first conductive pattern 440 and second conductive pattern 450) of the antenna structure 310 as an emissive layer may be designed to be approximately equal to half the wavelength of the signals being exchanged with an external device (e.g., to another electronic device), and the width of a feed line (e.g., first feed line 480 and second feed line 490) of the corresponding metal layer (e.g., front-end metal layer 410A and back-end metal layer 410B) may be designed to match a desired input impedance. According to an embodiment, the first feed line 480 and/or the second feed line 490 may be formed in an RFIC die. For example, the first feed line 480 may be formed in a first RFIC die 485 supporting a first frequency while the second feed line may be formed in a second RFIC die 495 supporting a second frequency.

According to various embodiments, through holes (e.g., first TSV 315 and second TSV 325) may be formed in the first and second RFIC dies 485 and 495 in a penetrating manner According to an embodiment, the through holes of the first and second RFIC dies 485 and 495 may be formed to provide an electrical connection path to the antenna interposer 420 (or molding layer of the antenna interposer 420) such that the RFIC 330 of the wafer 410 and the antenna structure 310 (e.g., first conductive pattern 440 and second conductive pattern 450) are electrically connected to each other. According to an embodiment it may also be possible to form an additional molding layer having a through hole for providing an electrical connection path between the first and second RFIC dies 485 and 495 and the antenna structure 310 (e.g., first conductive pattern 440 and second conductive pattern 450).

According to various embodiments, the antenna interposer 420 may have a molding layer on its outermost surface (e.g., top surface of the antenna interposer 420 in FIG. 4). According to an embodiment, the antenna structure 310 (e.g., first conductive pattern 440 and second conductive pattern 450) may be fabricated on a metal layer in the antenna interposer 420 or the molding layer on the outermost surface of the antenna interposer 420. According to an embodiment, in the case where the antenna structure 310 is fabricated on the molding layer of the antenna interposer 420, the antenna interposer 420 may not include the metal layer (e.g., metal layer 402A).

According to various embodiments, the first TSV 315 and/or the second TSV 325 formed between the surfaces of the wafer 410 and the antenna interposer 420 that face each other may be used for signal transfer between the wafer 410 and the antenna interposer 420. For example, the first TSV 315 (e.g., feeding TSV) may be formed in a first section interposed between facing surfaces of the wafer 410 and the antenna interposer 420 for signal transfer between the RFIC 330 and the antenna structure 310, and the second TSV 325 may be formed in a second section interposed between facing surfaces of the wafer 410 and the antenna interposer 420 for signal transfer between the antenna switch 320 and the antenna structure 310. For example, the first TSV 315 formed between the RFIC 330 and the antenna structure 310 may be used for the first feed line 480 and/or the second feed line 490, and the second TSV 325 formed between the antenna switch 320 and the antenna structure 310 may be used for selecting a band-specific antenna.

According to an embodiment, the first TSV 315 may be used for connection between the antenna structure 310 of the antenna interposer 420 and the RFIC 330 of the wafer 410 for signal exchange for feeding (or power supply) between the RFIC 330 implemented on the wafer 410 and the antenna structure 310. According to an embodiment, band switching may be performed by means of the antenna switch 320 when the band of the antenna structure 410 is changed and, in this case, signals may be mutually exchanged through the second TSV 325.

According to various embodiments, the antenna structure 310 may operate as an antenna for a first band (Band 1) (e.g., 39 GHz) by turning off (or opening) the antenna switch 320 connected to the antenna structure 310 as a default switch state (e.g. antenna implemented to have a relatively short length with the first conductive pattern 440).

According to various embodiments, the antenna structure 310 may operate as an antenna for a second band (Band 2) (e.g., 28 GHz) by turning on (or closing) the antenna switch 320 connected to the antenna structure 310 (e.g., an antenna implemented to have a relatively long length with the first and second conductive patterns 440 and 450).

According to various embodiments, it may be possible to design the antenna structure 310 to have band-specific antenna lengths using the antenna switch 320. For example, the antenna structure may be designed to have a first antenna length by turning on (or closing) the antenna switch 320 for the first band and a second antenna length by turning off (or opening) the antenna switch 320 for the second band. For example, the antenna switch 320 may be fabricated such that one end is connected to the first conductive pattern 440 associated with the first band and the other end is connected to the second conductive pattern 450 associated with the second band. According to an embodiment, the first antenna length may include the length of the first conductive pattern 440, and the second antenna length may include the length of the first conductive pattern 440 and the length of the second conductive pattern.

In the embodiment of FIG. 4, if the antenna switch 320 is turned off (or opened) to establish an electric connection to the first conductive pattern 440 in order for the antenna structure 310 to operate in the first band, the total length L of the antenna structure 310 may become, by way of example, length L1 obtained by summing the antenna length of the first band (e.g., L_Band1) (e.g., length of the first conductive pattern 440) and the length of the first TSV 315 (or ANT TSV) between the first conductive pattern 440 and the RFIC 330. According to an embodiment, if the antenna switch 320 is turned on (or closed) to establish an electrical connection to the first and second conductive patterns 440 and 450, the total length L of the antenna structure 310 may become, by way of example, length L2 obtained by summing the antenna length of the first band (L_Band1) (e.g., length of the first conductive pattern 440), the length of second TSV 325, i.e., sum of the length between the first conductive pattern 440 and the RFIC 330 and the length between the second conductive pattern 450 and the RFIC 330 (2×L_ANT TSV), the length of the antenna switch 320, and the antenna length for the second band (L_Band2) (e.g., length of the second conductive pattern 450).

Figure 5:
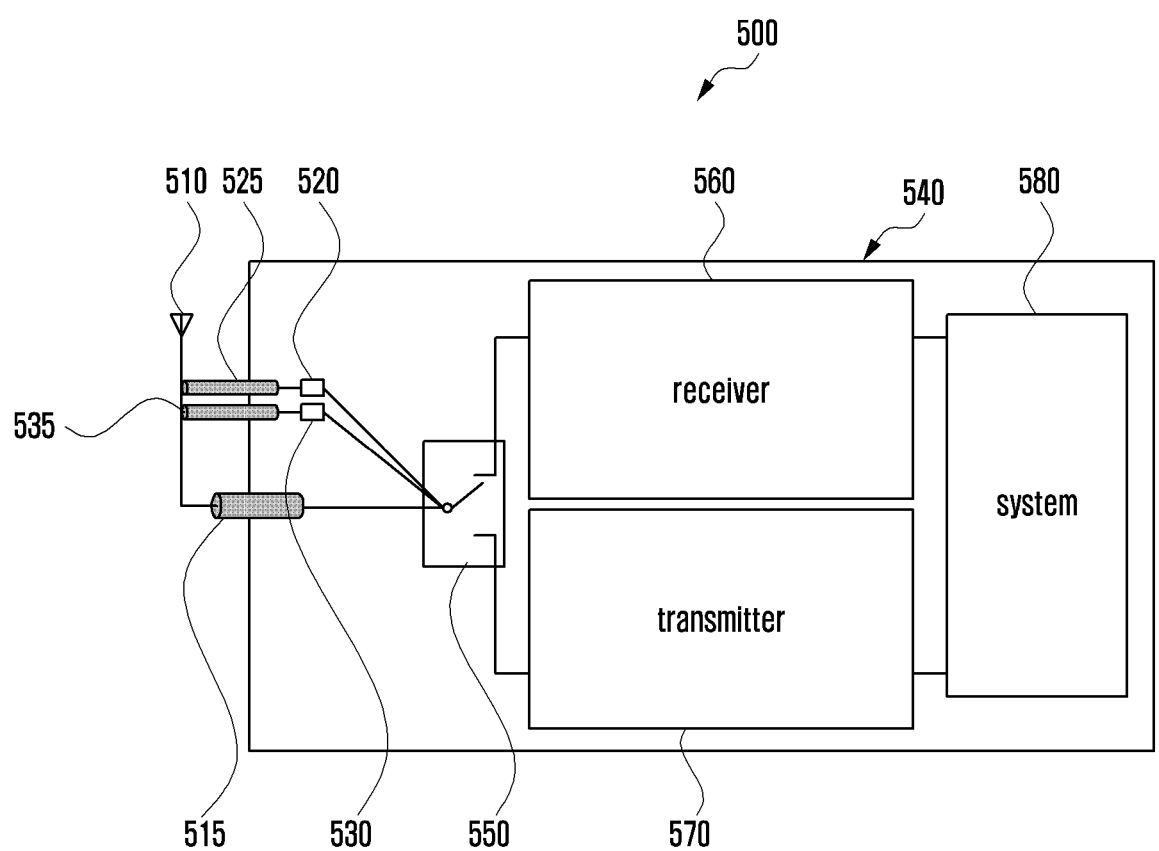
FIG. 5 is a diagram illustrating a communication chipset including a multiband on-chip antenna for an electronic device according to an embodiment of the disclosure.

FIG. 5 is a diagram illustrating a communication chipset including a multiband on-chip antenna for an electronic device according to an embodiment of the disclosure.

Referring to FIG. 5, a structure of a communication chipset for supporting multiple bands with an antenna structure 510 in frequency bands above 3 GHz such as mmWave is shown. According to various embodiments, the communication chipset 500 may be implemented to have a multi-band on-chip antenna with two antenna switches (e.g., first antenna switch 520 and second antenna switch 530).

In reference to FIG. 5, the communication chipset 500 may include the first and second antenna switches 520 and 530 or an RFIC 540. According to an embodiment, the communication chipset 500 may further include a system 580 for processing a signal to be transmitted to the outside (e.g., to another electronic device) and a signal received from the outside. According to an embodiment, the system 580 may include a chip operating on a LF chip. According to an embodiment, the first and second antenna switches 520 and 530 may be included in the RFIC 540. According to various embodiments, the antenna structure 510 and the first and second antenna switches 520 and 530 may be integrally expressed as a multiband integrated antenna, and the multiband integrated antenna implemented on a chip may be expressed as a multiband on-chip antenna.

According to various embodiments, some of the components depicted in FIG. 5 may be identical those described with reference to FIG. 3, and detailed descriptions thereof are omitted herein.

According to various embodiments, the antenna structure 510 may include the whole or part of the antenna module 197 of FIG. 1. According to various embodiments, the antenna structure 510 may work, by way of example, as an antenna operating in a first band (e.g., 39 GHz frequency spectrum) or as an antenna operating in a second band (e.g., 28 GHz frequency spectrum). According to various embodiments, the antenna structure 510 may be implemented, by way of example, in an interposer (e.g., antenna interposer 240 in FIG. 2) as a multiband integrated antenna. According to various embodiments, the antenna structure 510 may communicate signals with the RFIC 540 through the first TSV 515 (e.g., feeding TSV). How the antenna structure 510 is implemented in an interposer (e.g., antenna interposer 240 in FIG. 2) is described later with reference to FIG. 6.

According to various embodiments, the first antenna switch 520 or the second antenna switch 530 operate to select a band-specific operation of the antenna structure 510 (e.g., antenna operation for a first band and antenna operation for a second band). According to an embodiment, the first and second antenna switches 520 and 530 may be implemented as, but not limited to, MOSFET switches. According to various embodiments, the first and second antenna switches 520 and 530 may be implemented as part of an RFIC 540 in a wafer (e.g., wafer 210 in FIG. 2). According to various embodiments, the first and second antenna switches 520 and 530 may be electrically connected to or disconnected from the antenna structure 510 via a $(2-1)^{th}$ TSV 525 and a $(2-2)^{th}$ TSV 535.

According to various embodiments, the RFIC 540 may include a switch 550 for selecting a path for signal transmission/reception (e.g., a Tx/Rx switch) and an RF transceiver (e.g., receiver 560 and transmitter 570), and it may be implemented as a high-performance multifunctional integrated circuit (IC) for supporting two or more bands with a single chip. Some of the components of the RFIC 540 are identical in functionality with those described with reference to FIG. 3; thus, detailed descriptions thereof are omitted herein.

According to various embodiments, the antenna structure 510 is fabricated in an interposer (e.g., antenna interposer 240 in FIG. 2) while the first and second antenna switches 520 and 530 are fabricated for selecting an antenna necessary for a purpose in the wafer (e.g., wafer 210 in FIG. 2) such that the RFIC 540 is capable of selecting a necessary antenna (e.g., band-specific antenna operation).

Figure 6:
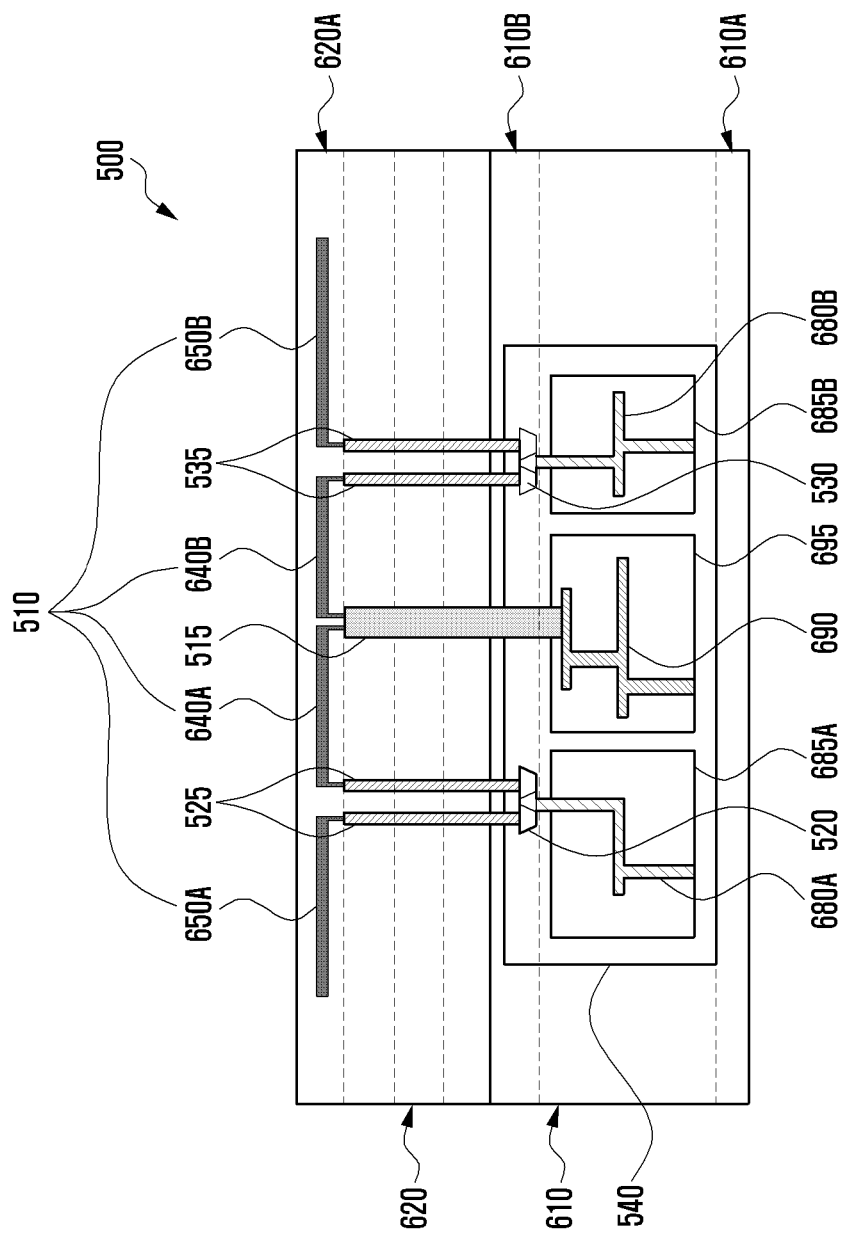
FIG. 6 is a cross-sectional view of the multiband on-chip antenna of FIG. 5 according to an embodiment of the disclosure.

FIG. 6 is a cross-sectional view of the multiband on-chip antenna of FIG. 5 according to an embodiment of the disclosure.

Referring to FIG. 6, how the multiband integrated antenna including the antenna structure 510 and multiple antenna switches (e.g., first and second antenna switches 520 and 530) is implemented (or designed) in the single communication chipset 500 of FIG. 5 in an on-chip manner for use in the electronic device 101 is shown.

FIGS. 5 and 6 may show some components that have been described with reference to FIGS. 3 and 4. For example, the wafer 610 including the antenna structure 510 (e.g., $(1-1)^{th}$ conductive pattern 640A, $(1-2)^{th}$ conductive pattern 640B, $(2-1)^{th}$ conductive pattern 650A, $(2-2)^{th}$ conductive pattern 650B), first and second antenna switches 520 and 530, or RFIC 540 including the first and second antenna switches 520 and 530, the wafer 610 including a metal layer (e.g., front-end metal layer 610A or back-end metal layer 610B) on which the RFIC 540 is implemented, and the antenna interposer 620 including the metal layer 620A on which the antenna structure 510 is implemented are similar in structure to those described with reference to FIG. 4; thus, detailed descriptions thereof are omitted herein. According to an embodiment, the conductive patterns 640A, 640B, 650A, and 650B of the antenna structure 510 may be implemented at part of a molding layer (e.g., molding layer for packaging) (not shown) formed on a surface (e.g., top surface as in FIG. 6) of the antenna interposer 620.

According to an embodiment, the communication chipset 500 may include at least one of the first antenna switch 520, the second antenna switch 530, the $(1-1)^{th}$ conductive pattern 640A, the $(1-2)^{th}$ conductive pattern 640B, the $(2-1)^{th}$ conductive pattern 650A, the $(2-2)^{th}$ conductive pattern 650B), a $(2-1)^{th}$ feed line 680A, a $(2-2)^{th}$ feed line 680B, a first TSV 515 (e.g., a feeding TSV), a $(2-1)^{th}$ TSV 525, a $(2-2)^{th}$ TSV 535, a first RFIC die 695 for supporting a first frequency, a first feed line 690 for first TSV 515, or a second RFIC die (e.g., $(2-1)^{th}$ RFIC die 685A and $(2-2)^{th}$ RFIC die 685B).

Referring to FIGS. 5 and 6, the multiband on-chip antenna may be implemented to include the RFIC 540 with the first and second antenna switches 520 and 530 in the wafer 610. For example, the RFIC 540 including the first and second antenna switches 520 and 530 may be fabricated on the front-end metal layer 610A or the back-end metal layer 610B of the wafer 610.

According to various embodiments, the antenna interposer 620 may be disposed so as to be bonded (situated) on a surface of the wafer 610 (e.g., top surface of the wafer 610 in FIG. 6). According to various embodiments, the antenna interposer 620 may include the antenna structure 510 supporting multiple bands (e.g., mmWave bands). According to an embodiment, the antenna structure 510 may be fabricated to include the $(1-1)^{th}$ conductive pattern 640A, the $(1-2)^{th}$ conductive pattern 640B, the $(2-1)^{th}$ conductive pattern 650A, and the $(2-2)^{th}$ conductive pattern 650B. According to various embodiments, the $(1-1)^{th}$ conductive pattern 640A, the $(1-2)^{th}$ conductive pattern 640B, the $(2-1)^{th}$ conductive pattern 650A, and the $(2-2)^{th}$ conductive pattern 650B may be fabricated on the metal layer 620A of the antenna interposer 620. According to an embodiment, the $(1-1)^{th}$ conductive pattern 640A and the $(1-2)^{th}$ conductive pattern 640B may be sorted into a first conductive pattern group, and the $(2-1)^{th}$ conductive pattern 650A and the $(2-2)^{th}$ conductive pattern 650B may be sorted into a second conductive pattern group.

According to various embodiments, the RFIC 540 including the first and second antenna switches 520 and 530 may be fabricated on the front-end metal layer 610A or the back-end metal layer 610B of the wafer 610, and the antenna structure 510 is fabricated on the metal layer 620A of the antenna interposer 620 to support multiple bands. According to various embodiments, the first and second antenna switches 520 and 530 for switching between multiple bands may be fabricated on a metal layer of the wafer 60 to be electrically connected to the $(1-1)^{th}$ conductive pattern 640A, the $(1-2)^{th}$ conductive pattern 640B, the $(2-1)^{th}$ conductive pattern 650A, and/or the $(2-2)^{th}$ conductive pattern 650B via the $(2-1)^{th}$ TSV 525 and/or the $(2-2)^{th}$ TSV 535. According to various embodiments, the antenna structure 510 may perform a switching operation to select a required band with the first and second antenna switches 520 and 530 implemented on the wafer.

According to various embodiments, a signal transfer between the wafer 610 and the antenna interposer 620 may be performed via the first TSV 515, the $(2-1)^{th}$ TSV 525, and/or the $(2-2)^{th}$ TSV 535 formed across the boundary between the wafer 610 and the antenna interposer 620. According to an embodiment, the signal transfer between the RFIC 540 and the antenna structure 510 may be performed through the first TSV 515 (e.g., a feeding TSV) formed at a first section in which a surface of the wafer 610 and a surface of the antenna interposer 620 face each other. According to an embodiment, the signal transfer between the first antenna switch 520 and the $(1-1)^{th}$ conductive pattern 640A and the $(2-1)^{th}$ conductive pattern 650A may be performed through the $(2-1)^{th}$ TSV 525 (e.g., an antenna TSV) formed at a second section in which a surface of the wafer 610 and a surface of the antenna interposer 620, and the signal transfer between the second antenna switch 530 and the $(1-2)^{th}$ conductive pattern 640B and the $(2-2)^{th}$ conductive pattern 650B may be performed through the $(2-2)^{th}$ TSV 535 formed at a third section in which a surface of the wafer 610 and a surface of the antenna interposer 620. According to an embodiment, the first TSV 515 may be used as a feed line between the RFIC 540 and the $(1-1)^{th}$ conductive pattern 640A and a feed line between the RFIC 540 and the $(1-2)^{th}$ conductive pattern 640B, and the $(2-1)^{th}$ TSV 525 and the $(2-2)^{th}$ TSV 535 may be used for band-specific antenna selection. For example, the antenna structure 510 of the antenna interposer 620 and the RFIC 540 of the wafer 610 may be connected via the first TSV 515 to exchange signals for feeding (power supply) between the RFIC 540 and the antenna structure 510. The operation band of the antenna structure 510 may be changed by means of the first and second antenna switches 520 and 530 based on signal exchange via the $(2-1)^{th}$ TSV 525 or the $(2-2)^{th}$ TSV 535.

According to various embodiments, the antenna structure 510 may be configured to work as an antenna operating in a first band (Band 1) (e.g., 39 GHz) by switching off (or opening) the first antenna switch 520 or the second antenna switch 530 connected to the antenna structure 510 (e.g., antenna having a relatively short length including lengths of the $(1-1)^{th}$ conductive pattern 640A and the $(1-2)^{th}$ conductive pattern 640B). According to various embodiments, the antenna structure 510 may be configured to work as an antenna operating in a second band (Band 2) (e.g., 28 GHz) by switching on (or closing) the first antenna switch 520 and the second antenna switch 530 connected to the antenna structure 510 (e.g., an antenna having a relatively long length including the lengths of the $(1-1)^{th}$ conductive pattern 640A, the $(1-2)^{th}$ conductive pattern 640B, the $(2-1)^{th}$ conductive pattern 650A, and the $(2-2)^{th}$ conductive pattern 650B).

In the embodiment of FIG. 6, if the first antenna switch 520 or the second antenna switch 530 is switched off (or opened) such that the $(1-1)^{th}$ conductive pattern 640A and the $(1-2)^{th}$ conductive pattern 640B are electrically connected to form an antenna for the first band, the total length L of the antenna structure 510 may become, by way of example, length L11 obtained by summing an antenna length for the first band (e.g., L_Band1) (e.g., lengths of the $(1-1)^{th}$ conductive pattern 640A and the $(1-2)^{th}$ conductive pattern 640B) and the length of the first TSV 515 (e.g., ANT TSV). According to an embodiment, if the first and second antenna switches 520 and 530 are switched on (or closed) such that the conductive patterns 640A, 640B, 650A, and 650B are electrically connected to form an antenna for the second band, the total length L of the antenna structure 510 may become, by way of example, length L22 obtained by summing an antenna length for the first band (e.g., L_Ban1) (e.g., sum of the lengths of the $(1-1)^{th}$ conductive pattern 640A and the $(1-2)^{th}$ conductive pattern 640B), lengths of the $(2-1)^{th}$ TSV 525 and $(2-2)^{th}$ TSV 535 (e.g., L_ANTTSV), lengths of the first and second antenna switches 520 and 530 (e.g., L_ANTSW), and an antenna length for the second band (e.g., L_Band2) (e.g., lengths of the $(2-1)^{th}$ conductive pattern 650A and the $(2-2)^{th}$ conductive pattern 650B).

Figure 7A:
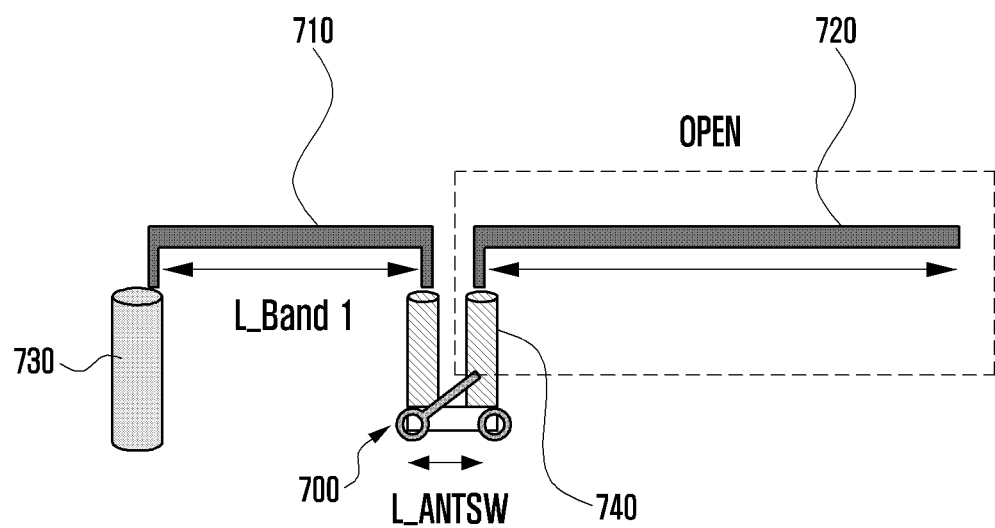
FIG. 7A is a diagram illustrating a configuration of a multi-band on-chip antenna for supporting multiple bands using a switch according to an embodiment of the disclosure.
Figure 7B:
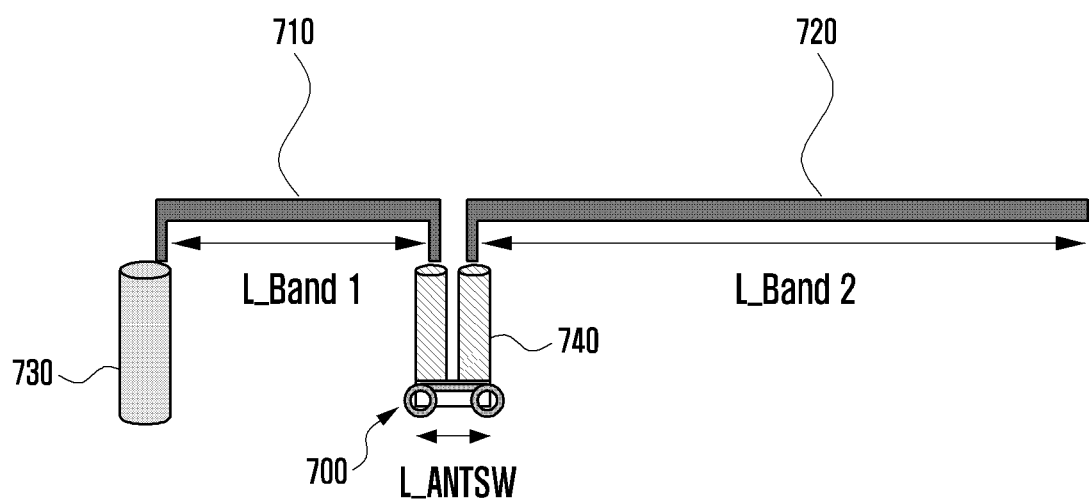
FIG. 7B is a diagram illustrating a configuration of a multi-band on-chip antenna for supporting multiple bands using a switch according to an embodiment of the disclosure.

FIGS. 7A and 7B are diagrams illustrating a multiband on-chip antenna with a switch for supporting multiple antennas according to various embodiments of the disclosure.

Hereinafter, descriptions are made of the band-specific antenna selection methods for switching between multiple bands (e.g., a first band of 39 GHz and a second band of 28 GHz) by switching on/off (or closing/opening) an antenna switch 700 according to various embodiments.

Referring to FIG. 7A, an antenna switch 700 that is in an off state (or open) is shown. If the antenna switch 700 is in the off state, an antenna structure (e.g., antenna structure 250 in FIG. 2) connects to an RFIC (e.g., RFIC 220 in FIG. 2) via a first TSV 730 so as to work as an antenna for a first band (e.g., 39 GHz). For example, the antenna structure (e.g., antenna structure 250 in FIG. 2) may disconnect a connection to a second conductive pattern 720 for a second band (e.g., 28 GHz) via the second TSV 740.

According to an embodiment, if the antenna switch 700 is in the off state, the electronic device 101 may perform a first operation associated with communication in the first band (e.g., 39 GHz) using the first conductive pattern 710. According to an embodiment, in the case where the electronic device 101 performs the first operation, the total length of the antenna structure may include an antenna length (L_Band1) of the first conductive pattern 710 for the first band and the length (L_ANTTSV) of the first TSV 730.

Referring to FIG. 7B, the antenna switch 700 that is in an on state (or closed) is shown. If the antenna switch 700 is in the on state, the antenna structure (e.g., antenna structure 250 in FIG. 2) connects to the RFIC (e.g., RFIC 220 in FIG. 2) via the first TSV 730 and to the second conductive pattern 720 via the second TSV 740 for the second band (e.g., 28 GHz). In this way, the antenna structure may work as an antenna formed with the first and second conductive patterns 710 and 720 to operate in the second band.

According to an embodiment, if the antenna switch 700 is in an on state, the electronic device 101 may perform a second operation associated with communication in the second band (e.g., 28 GHz) using the first and second conductive patterns 710 and 720. According to an embodiment, in the case where the electronic device 101 performs the second operation, the total length of the antenna structure may include the antenna length (e.g., L_Band1) of the first conductive pattern for the first band, the lengths of the two second TSVs 740 (e.g., 2×L_ANTTSV), the length of the antenna switch 700 (L_ANTSW), and the antenna length (e.g., L_Band2) of the conductive pattern 720 for the second band.

According to various embodiments, at least one of the length (e.g., L_ANTTSV) of the first TSV 730, the length (e.g., L_ANTSW) of the antenna switch 700, or the length of the second TSV 740 may be implemented to have a size so small as not to affect the performance of the antenna, by way of example, a few micrometers (um) or nanometers (nm) considering a silicon process. However, the disclosure is not limited thereto and may include various embodiments in which an antenna is designed in consideration of the length (e.g., L_ANTSV) of the first TSV 730, the length (e.g., L_ANTSW) of the antenna switch 700, and the length of the second TSV 740, if necessary.

According to various embodiments, although the antenna structure supports multiple bands (e.g., first and second bands), it may be possible to minimize a coupling impact between two bands using the antenna switch 700. For example, in the case of using the first conductive pattern as shown in FIG. 7A, the second conductive pattern 720 may not produce any coupling impact because any interference between the first and second conductive patterns 710 and 720 is canceled because the antenna switch 700 is switched off (opened). For example, if the antenna switch 700 is in the off (or open) state, the first and second conductive patterns 710 and 720 of the antenna structure are not coupled.

According to various embodiments, it may be possible to implement a system on-chip antenna through packaging without any bump and reduce signal redundancy and save power in such a way of exchanging signals between the RFIC (e.g., RFIC 220 in FIG. 2) of the wafer (e.g., wafer 210 in FIG. 2), the antenna interposer (e.g., antenna interposer 240 of FIG. 2), and the antenna structure (e.g., antenna structure 250 in FIG. 2) through the TSVs (e.g., first and second TSVs 730 and 740).

According to various embodiments, a multiband antenna is implemented with one feed line, thereby reducing a number of feed lines necessary for a number of antennas and facilitating fabrication, resulting in fabrication cost reduction.

Hereinabove, the description has been made of the multiband integrated antenna for switching between multiple bands (e.g., first and second bands) with at least one antenna switch (e.g., antenna switch 230 in FIG. 2) in the antenna structure (e.g., antenna structure 250 in FIG. 2) according to various embodiments. Hereinafter, a description is made of a multiband integrated antenna for switching among more bands using an antenna switch switching among multiple antenna elements.

Figure 8:
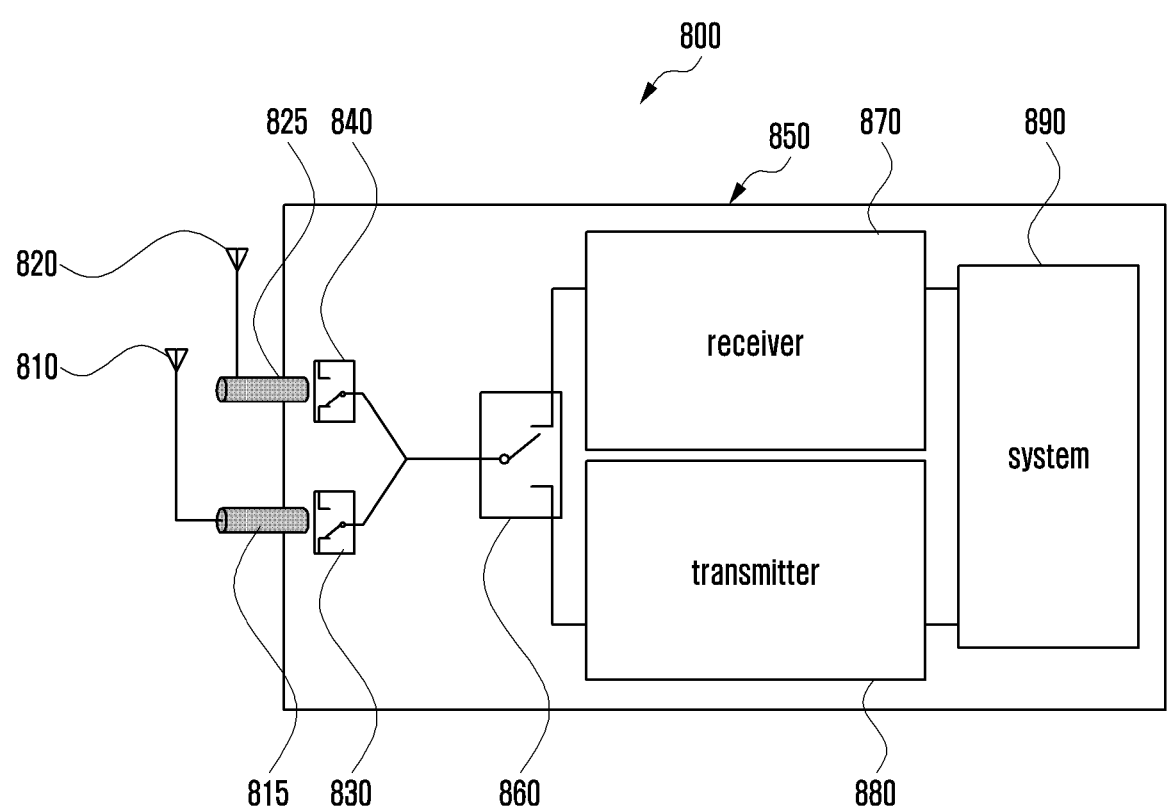
FIG. 8 is a diagram illustrating a communication chipset including a multiband on-chip antenna for an electronic device according to an embodiment of the disclosure.

FIG. 8 is a diagram illustrating a communication chipset including a multiband on-chip antenna for an electronic device according to an embodiment of the disclosure.

Referring to FIG. 8, a configuration of a communication chipset 800 (e.g., communication module 190 and antenna module 197 in FIG. 1) for supporting multiple bands using at least one of a first antenna structure 810 or a second antenna structure 820 operating in an above 3 GHz frequency band such as a mmWave frequency band is shown. According to various embodiments, the communication chipset 800 may be implemented as a multiband on-chip antenna with at least one of a first antenna switch 830 or a second antenna switch 840.

In reference to FIG. 8, the communication chipset 800 may include the first antenna structure 810, the second antenna structure 820, the first antenna switch 830, the second antenna switch 840, and an RFIC 850. According to an embodiment, the communication chipset 800 may further include a system 890 for processing signals to be transmitted to the outside (e.g., to another electronic device) and signals received from the outside. According to an embodiment, the system 890 may include a LF chip. According to various embodiments, the first antenna switch 830 or the second antenna switch 840 may be included in the RFIC 850. According to various embodiments, the first antenna structure 810, the first antenna switch 830, the second antenna structure 820, and the second antenna switch 840 may be integrally expressed as a multiband integrated antenna, and the multiband integrated antenna implemented on a chip may be expressed as a multiband on-chip antenna.

According to various embodiments, some of the components depicted in FIG. 8 may be identical to those described with reference to FIG. 3, and detailed descriptions thereof are omitted herein.

According to various embodiments, the first antenna structure 810 or the second antenna structure 820 may include the whole or part of the antenna module 197 of FIG. 1 by way of example. According to various embodiments, the first antenna structure 810 may work as an antenna operating in a first band (e.g., 39 GHz), and the second antenna structure 820 may work as an antenna operating in a second band (e.g., 28 GHz). According to various embodiments, the first antenna 810 or the second antenna 820 may be implemented as a multiband integrated antenna in an interposer (e.g., antenna interposer 240 in FIG. 2). According to various embodiments, the first antenna structure 810 may communicate signals with the RFIC 850 through a connection link established via a $(1-1)^{th}$ TSV 815 and the first antenna switch 830, and the second antenna structure 820 may communicate signals with the RFIC 850 through a connection link established via a $(1-2)^{th}$ TSV 825 (e.g., feeding TSV) and the second antenna switch 840.

According to various embodiments, the first switch 830 or the second switch 840 may select a band-specific operation of the first antenna structure 810 or the second antenna structure 820 (e.g., first antenna structure 810 or the second antenna structure 820 as an antenna operating in the first band or the second band). According to an embodiment, the first antenna switch 830 or the second antenna switch 840 may be implemented as, but not limited to, a MOSFET switch. According to various embodiments, the first antenna switch 830 or the second antenna switch 840 may be implemented as part of the RFIC 850 fabricated in a wafer (e.g., wafer 210 in FIG. 2). According to various embodiments, the first antenna switch 830 or the second antenna switch 840 may electrically connect or disconnect the $(1-1)^{th}$ TSV 815 or the $(1-2)^{th}$ TSV 825 to or from the first antenna structure 810 or the second antenna structure 820.

According to various embodiments, the RFIC 850 may include a switch 860 (e.g., a Tx/Rx switch) for selecting a signal transmission/reception path and an RF transceiver (e.g., receiver 870 and transmitter 880) for supporting multiple bands, and it may be implemented by a high-performance IC for supporting two or more bands using a single chip. Some of the components of the RFIC 540 are identical in functionality with those described with reference to FIG. 3; thus, detailed descriptions thereof are omitted herein.

According to various embodiments, an antenna supporting multiple bands may be implemented by separating feed lines (e.g., $(1-1)^{th}$ TSV 815 and $(1-2)^{th}$ TSV 825) for the first antenna structure 810 and the second antenna structure 820 as exemplified in FIG. 8. According to various embodiment, the first antenna structure 810 or the second antenna structure 820 is fabricated in the interposer (e.g., antenna interposer 240 in FIG. 2) while the first antenna switch 830 or the second antenna switch 840 is fabricated for selecting an antenna necessary for a purpose in the wafer (e.g., wafer 210 in FIG. 2) such that the RFIC 850 is capable of selecting a necessary antenna (e.g., band-specific antenna operation).

Figure 9:
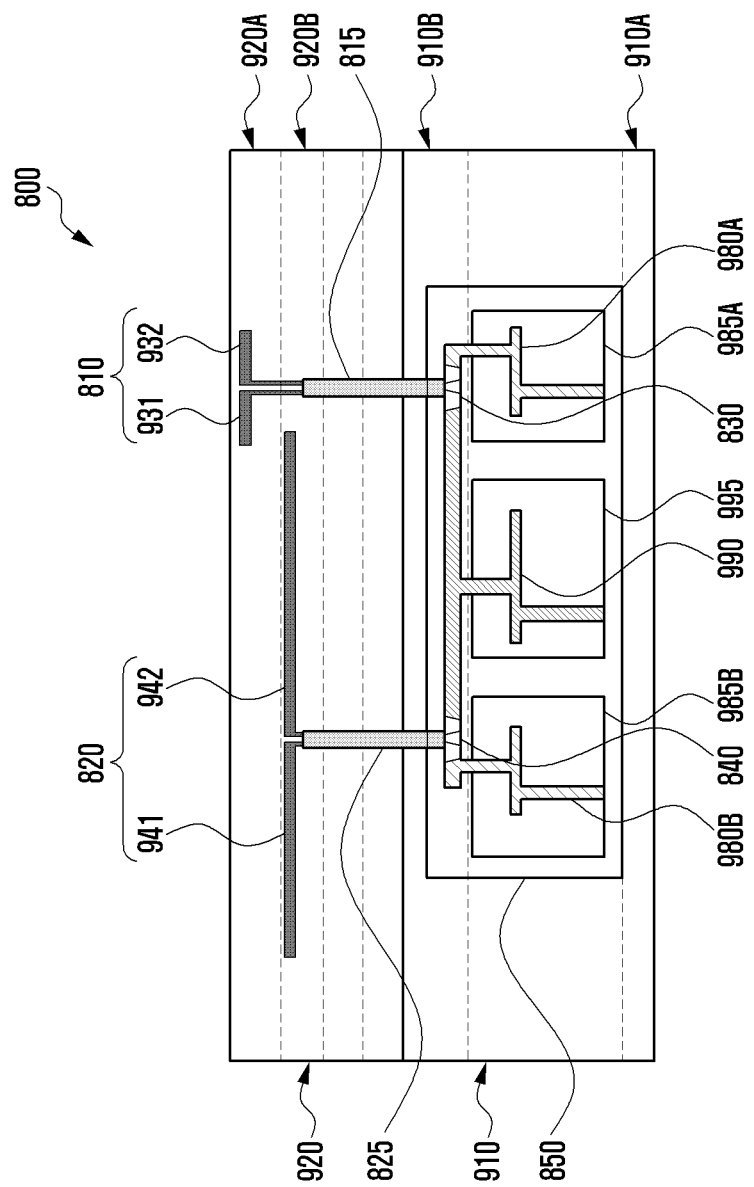
FIG. 9 is a cross-sectional view of the multiband on-chip antenna of FIG. 8 according to an embodiment of the disclosure.

FIG. 9 is a cross-sectional view of the multiband on-chip antenna of FIG. 8 according to an embodiment of the disclosure.

Referring to FIG. 9, how the multiband integrated antenna including the first and second antenna structures 810 and 820 and the first and second antenna switches 830 and 840 is implemented (designed) in a communication chipset 800 of FIG. 8 in an on-chip manner for use in the electronic device 101 is shown.

According to various embodiments, the multiband on-chip antenna may include the first antenna structure 810 for the first band and a second antenna structure for the second band. According to various embodiments, the antenna interposer 920 may include multiple metal layers. According to an embodiment, the first and second antenna structures 810 and 820 may be fabricated in at least one of the metal layers of the antenna interposer 920. According to an embodiment, the first and second antenna structures 810 and 820 may be disposed in a first manner (e.g., horizontally) or a second manner (e.g., vertically). In the embodiment of FIG. 9, the first antenna structure 810 for the first band is fabricated on the first metal layer 920A of the antenna interposer 920, and the second antenna structure 820 for the second band is fabricated on the second metal layer 920B such that the first and second antenna structures 810 and 820, i.e., the first and second antenna structures 810 and 820, are fabricated on different metal layers so as to be arranged vertically.

In reference to FIGS. 8 and 9, the RFIC 850 including the first and second antenna switches 830 and 840 may be fabricated on a certain metal layer of a wafer 910. For example, the RFIC 850 including at least one of the first and second antenna switches 830 and 840 may be fabricated on a front-end metal layer 910A or a back-end metal layer 910B of the wafer 910.

According to various embodiments, the antenna interposer 920 may be disposed so as to be bounded (situated) onto a surface of the wafer 910 (e.g., top surface of the wafer 910 in FIG. 9). According to various embodiments, the antenna interposer 920 may include a metal layer (e.g., first metal layer 920A and second metal layer 920B) on which the first antenna structure 810 (e.g., $(1\text{-}1)^{th}$ conductive pattern 931 and $(1\text{-}2)^{th}$ conductive pattern 932) for supporting the first band and the second antenna structure 820 (e.g., $(2\text{-}1)^{th}$ conductive pattern 941 and $(2\text{-}2)^{th}$ conductive pattern 942) for supporting the second band may be fabricated. According to various embodiments, the first and second antenna structures 810 and 820 may be fabricated on different metal layers (e.g., first metal layer 920A and second metal layer 920B) of the antenna interposer 920. According to an embodiment, the first antenna structure 810 (e.g., $(1\text{-}1)^{th}$ conductive pattern 931 and $(1\text{-}2)^{th}$ conductive pattern 932) may be fabricated on the first metal layer 920A of the antenna interposer 920, and the second antenna structure 820 (e.g., $(2\text{-}1)^{th}$ conductive pattern 941 and $(2\text{-}2)^{th}$ conductive pattern 942 may be fabricated on the second metal layer 920B of the antenna interposer 920.

According to various embodiments, the first antenna structure 810 (e.g., $(1\text{-}1)^{th}$ conductive pattern 931 and $(1\text{-}2)^{th}$ conductive pattern 932) and the second antenna structure 820 (e.g., $(2\text{-}1)^{th}$ conductive pattern 941 and $(2\text{-}2)^{th}$ conductive pattern 942) are selected by means of the first and second antenna switches 830 and 840 fabricated in the wafer 910 according to a target band.

According to various embodiments, a signal transfer between the wafer 910 and the antenna interposer 920 may be performed via the $(1\text{-}1)^{th}$ TSV 815 and/or the $(1\text{-}2)^{th}$ TSV 825 formed across the boundary between the wafer 910 and the antenna interposer 920. According to an embodiment, the signal transfer between the RFIC 850 and the first antenna structure 810 may be performed through the $(1\text{-}1)^{th}$ TSV 815 formed at a first section in which a surface of the wafer 910 and a surface of the antenna interposer 920 face each other. According to an embodiment, the signal transfer between the RFIC 850 and the second antenna structure 820 may be performed through the $(1\text{-}2)^{th}$ TSV 825 for at a second section in which a surface of the wafer 910 and a surface of the antenna interposer 920 face each other.

According to various embodiments, a first feed line 990 and/or a $(2\text{-}1)^{th}$ feed line 980A for communicating signals between the first antenna structure 810 and the RFIC 850 or forming a band-specific antenna may be connected to the $(1\text{-}1)^{th}$ TSV 815 formed between the first antenna structure 810 and the first antenna switch 830. According to an embodiment, a feed line (e.g., first feed line 990 and $(2\text{-}2)^{th}$ feed line 980B) for communicating signals between the second antenna structure 820 and the RFIC 850 or forming a band-specific antenna may be connected to the $(1\text{-}2)^{th}$ TSV 825 formed between the second antenna structure 820 and the second antenna switch 840. According to an embodiment, the first feed line 990 may be formed in a first RFIC die 995 for supporting a first frequency, the $(2\text{-}1)^{th}$ feed line 980A may be formed in a $(2\text{-}1)^{th}$ RFIC die 985A for supporting a second frequency, and the $(2\text{-}2)^{th}$ feed line 980B may be formed in a $(2\text{-}2)^{th}$ RFIC die 985B) for supporting the second frequency.

According to an embodiment, the $(1\text{-}1)^{th}$ TSV 815 may be used for communicating signals between the RFIC 850 fabricated in the wafer 910 and the first antenna structure 810 for feeding (or power supply), and the $(1\text{-}2)^{th}$ TSV 825 may be used for communicating signals between the RFIC 850 and the second antenna structure 820 for feeding. According to an embodiment, band switching may be performed by means of the first antenna switch 830 or the second antenna switch 840 and, in this case, signals are exchanged through the $(1\text{-}1)^{th}$ TSV 815 or the $(1\text{-}2)^{th}$ TSV 825.

According to various embodiments, a first antenna for a first band (39 GHz) (e.g., an antenna having a relatively short length obtained by summing the length of the $(1\text{-}1)^{th}$ conductive pattern 931 and the length of the $(1\text{-}2)^{th}$ conductive pattern 932) may be formed by switching off (opening) the second antenna switch 840 connected to the second antenna structure 820 and switching on (or closing) the first antenna switch 830 connected to the first antenna structure 810. According to various embodiments, a second antenna for a second band (e.g., 28 GHz) (e.g., an antenna having a relatively long length obtained by summing the length of the $(2\text{-}1)^{th}$ conductive pattern 941 and the length of the $(2\text{-}2)^{th}$ conductive pattern 942) may be formed by switching off (opening) the first antenna switch 830 connected to the first antenna structure 810 and switching on (closing) the second antenna switch 840 connected to the second antenna structure 820.

Figure 10:
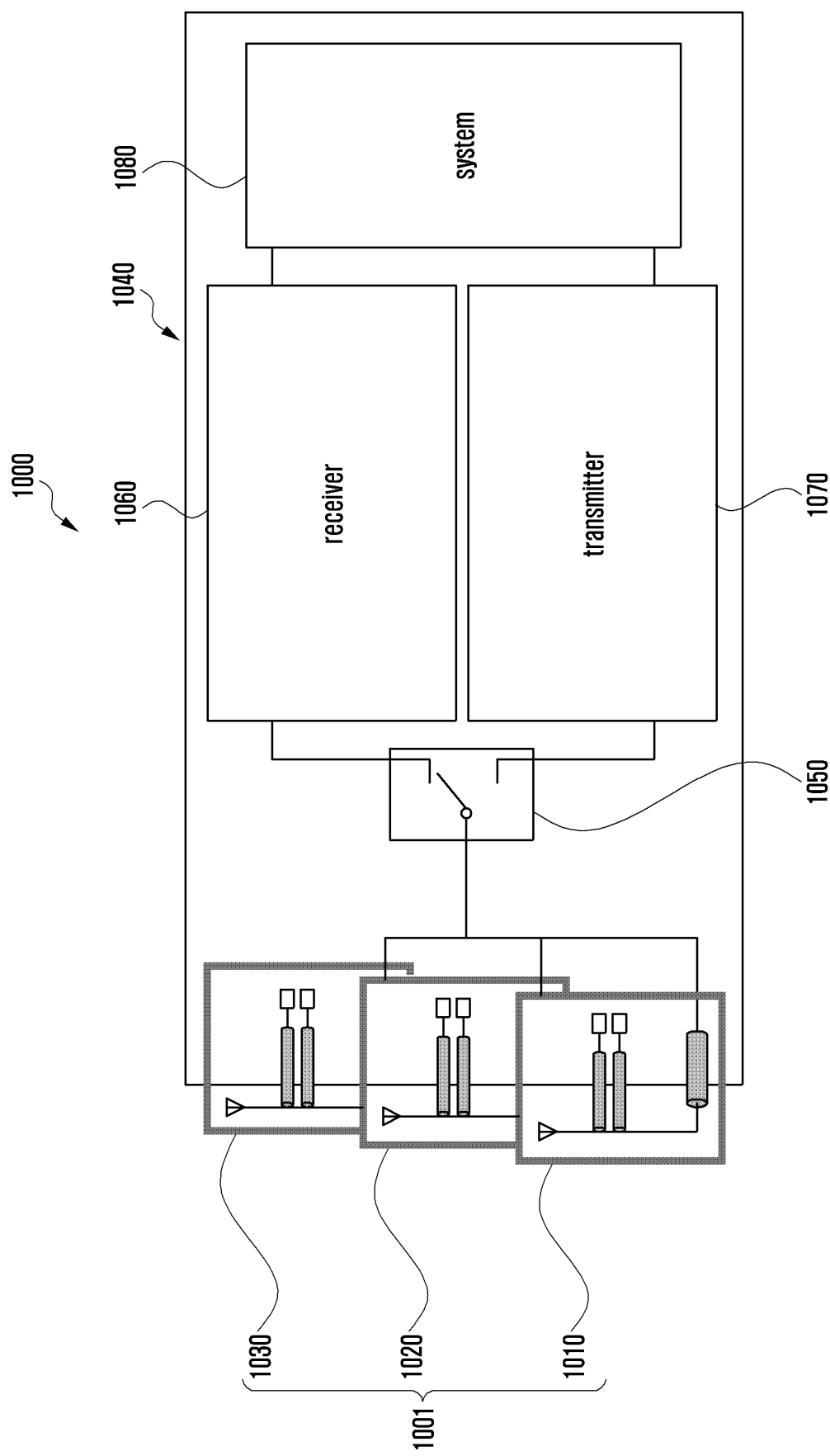
FIG. 10 is a diagram illustrating a communication chipset including a multiband on-chip array antenna for an electronic device according to an embodiment of the disclosure.

FIG. 10 is a diagram illustrating a communication chipset including a multiband on-chip array antenna for an electronic device according to an embodiment of the disclosure.

Referring to FIG. 10, a configuration of a multiband on-chip array antenna 1001 operating with a switch according to various embodiments is shown. For example, FIG. 10 shows a configuration of a communication chipset 1000 for supporting multiple bands using an array antenna 1001 (e.g., first antenna set 1010 (or antenna group), a second antenna set 1020, and third antenna set 1030). According to various embodiments, a multiband on-chip array antenna may be implemented with an antenna switch in the communication chipset 1000.

In reference to FIG. 10, the communication shipset 1000 may include the first antenna set 1010, the second antenna set 1020, the third antenna set 1030, and an RFIC 1040. According to various embodiments, the first antenna set 1010, the second antenna set 1020, and the third antenna set 1030 may each consist of antennas and an antenna switch so as to act as a multiband antenna and may be connected to constitute the array antenna 1001. For example, the first antenna set 1010, the second antenna set 1020, and the third antenna set 1030 may each correspond to the multiband on-chip antenna described above with reference to FIG. 5.

According to an embodiment, the communication chipset 1000 may further include a system 1080 for processing signals to be transmitted to the outside (e.g., to another electronic device) and signals received from the outside.

According to an embodiment, the system 1080 may include a LF chip. According to various embodiments, at least one of a first antenna switch of the first antenna set 1010, a second antenna switch of the second antenna set 1020, and a third antenna switch of the third antenna set 1030 may be included in an RFIC 1040.

According to various embodiments, some of the components depicted in FIG. 10 may be identical to those described with reference to FIG. 5, and detailed descriptions thereof are omitted herein. In the embodiment of FIG. 10, the RFIC 1040 may include a switch 1050 (e.g., a Tx/Rx switch) for selecting a signal transmission/reception path and an RF transceiver (e.g., receiver 1060 and transmitter 1070) for supporting multiple bands. Some of the components of the RFIC 1040 are identical in functionality with those described with reference to FIG. 5; thus, detailed descriptions thereof are omitted herein.

According to various embodiments, the first antenna set 1010, the second antenna set 1020, and the third antenna set 1030 may each include an antenna structure and a switch for forming antennas for a first band (e.g., 39 GHz) and a second band (e.g., 28 GHz). According to an embodiment, the antenna structure of each of the first to third antenna sets 1010, 1020, and 1030 may be fabricated in an antenna interposer (e.g., antenna interposer in FIG. 2) and may communicate signals with the RFIC 1040 through a TSV (e.g., feeding TSV) and an antenna switch connected to the TSV.

According to various embodiments, the first to third antenna sets 1010, 1020, and 1030 may each connect to a first antenna switch and a second antenna switch, which are switched on/off such that the antenna structure of the corresponding antenna set forms an antenna for the first band or the second band. According to an embodiment, the first antenna switch (e.g., first antenna switch 520 in FIG. 5) and the second antenna switch (e.g., second antenna switch 530 in FIG. 5) that are connected to each of the first to third antenna sets 1010, 1020, and 1030 may be implemented as, but not limited to, MOSFET switches. According to various embodiments, the first antenna switch (e.g., first antenna switch 520 in FIG. 5) and the second antenna switch (e.g., second antenna switch 530 in FIG. 5) that are connected to each of the first to third antenna sets 1010, 1020, and 1030 may be formed as part of the RFIC 1040 fabricated in a wafer (e.g., wafer 210 in FIG. 2). According to various embodiments, the first antenna switch (e.g., first antenna switch 520 in FIG. 5) and the second antenna switch (e.g., second antenna switch 530 in FIG. 5) that are connected to one of the first to third antenna sets 1010, 1020, and 1030 may operate such that the corresponding antenna set and the corresponding TSV are electrically connected to or disconnected from each other.

Figure 11:
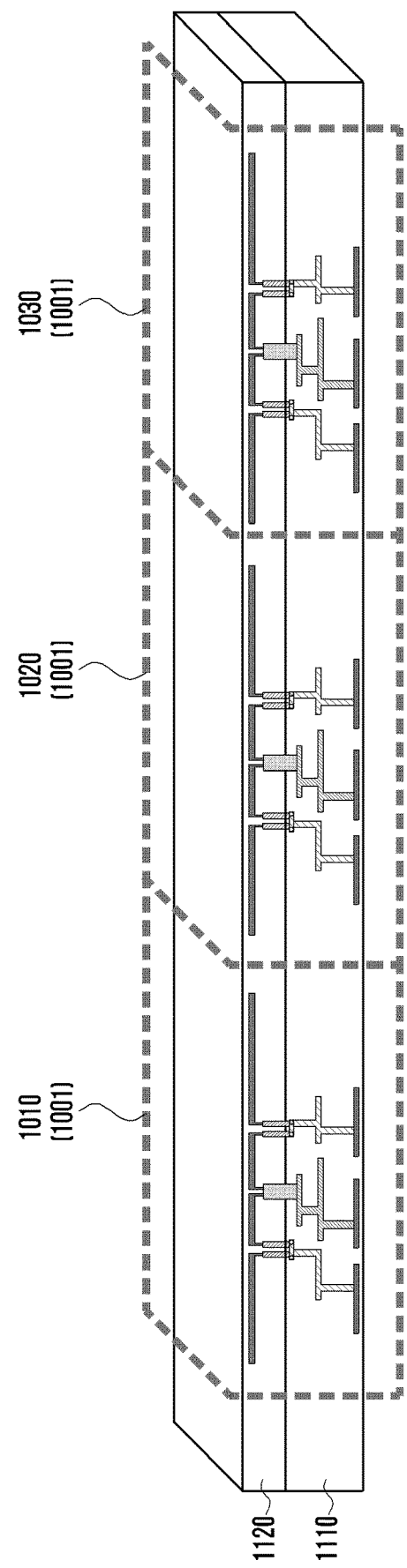
FIG. 11 is a cross-sectional view of the multiband on-chip array antenna of FIG. 10 according to an embodiment of the disclosure.

FIG. 11 is a cross-sectional view of the multiband on-chip array antenna of FIG. 10 according to an embodiment of the disclosure.

Referring to FIG. 11, how the multiband integrated antenna including an array antenna 1001 (e.g. first antenna set 1010, second antenna set 1020, and third antenna set 1030) that is implemented (designed) in the communication chipset 1000 of FIG. 10 in an on-chip manner for use in an electronic device 101 is shown.

According to various embodiments, the multiband on-chip array antenna 1001 may selectively perform an antenna operation for a first band and an antenna operation for a second band by means of antenna structures and antenna switches associated with the first to third antenna sets 1010, 1020, and 1030. For example, the first to third antenna sets 1010, 1020, and 1030 may be configured to operate as an array antenna for the first band by switching off (or opening) the corresponding antenna switches or an array antenna for the second band by switching on (or closing) the corresponding antenna switches.

According to various embodiments, the antenna structures, antenna switches, and TSVs (e.g., feeding TSV and ANT TSV) that are associated respectively with the first to third antenna sets 1010, 1020, and 1030 may be implemented in a wafer 1110 and an antenna interposer 1120 in the same manner as that described with reference to FIG. 6; thus, detailed descriptions thereof are omitted.

According to various embodiments, the electronic device 101 may include a wafer (e.g., wafer 210 in FIG. 2), an RFIC (e.g., RFIC 220 in FIG. 2) fabricated in the wafer 210, an antenna interposer (e.g., antenna interposer 240 in FIG. 2) disposed on one surface of the wafer 210, an antenna structure (e.g., antenna structure 250 in FIG. 2) fabricated in the antenna interposer 240 to have a first conductive pattern (e.g., first conductive pattern 440 in FIG. 4) with a first electrical length and a second conductive pattern (e.g., second conductive pattern 450 in FIG. 4) with a second electrical length), a switch (e.g., antenna switch 230 in FIG. 2) formed in the RFIC 220 to establish an electrical connection to at least one of the first conductive pattern 440 or the second conductive pattern 450 based on a frequency band of signals being transmitted and/or received by the RFIC 220, and a through hole (e.g., first TSV 315 and second TSV 325) that electrically connects the RFIC 220 to the antenna structure 250.

According to various embodiments, examples of the frequency band may include a first frequency band and a second frequency band.

According to various embodiments, the first frequency band includes a 39 GHz frequency, and the second frequency band includes a 28 GHz frequency.

According to various embodiments, the first conductive pattern 440 may be fabricated to have a first antenna length for the first frequency band, and the second conductive pattern 450 may be fabricated to have a second antenna length for the second frequency band.

According to various embodiments, the wafer 210 and the antenna interposer 240 may be formed to be electrically connected to each other via through holes (e.g., first TSV 315 and second TSV 325 in FIG. 3).

According to various embodiments, the through holes (e.g., first TSV 315 and second TSV 325 in FIG. 3) may be formed in such a way of filling conductive materials in holes formed at a section where a surface of the wafer 210 and a surface of the antenna interposer 240 face each other.

According to various embodiments, the through holes (e.g., first TSV 315 and second TSV 325 in FIG. 3) may include a first through hole (e.g., first TSV 315) formed between the RFIC 220 and the antenna structure 250 and a second through hole (e.g., second TSV 325 in FIG. 3) formed between the antenna switch 230 and the antenna structure 250.

According to various embodiments, the through holes (e.g., first TSV 315 and second TSV 325 in FIG. 3) may be fabricated as silicon penetration electrodes (TSV).

According to various embodiments, the through holes (e.g., first TSV 315 and second TSV 325 in FIG. 3) may be fabricated as glass penetration electrodes (through glass via (TGV)).

According to various embodiments, the antenna interposer 240 may be formed as a silicon interposer.

According to various embodiments, the antenna interposer 240 may be formed as a glass interposer.

According to various embodiments, the antenna switch 230 may include a MOSFET switch.

According to various embodiments, the antenna switch 230 may be included in the RFIC 220 and electrically connected to the antenna structure 250 fabricated in the antenna interposer 240 through the through hole (e.g., first TSV 315 and second TSV 325 in FIG. 3).

According to various embodiments, the wafer 210 may include a plurality of metal layers including front-end metal layers and/or back-end metal layers.

According to various embodiments, the RFIC 220 may be fabricated in at least one of the front-end metal layers (e.g., front-end metal layer 410A in FIG. 4).

According to various embodiments, the RFIC 220 may be fabricated in at least one of the back-end metal layers (e.g., back-end metal layer 410B in FIG. 4).

According to various embodiments, the antenna interposer 240 may include at least one metal layer (e.g., metal layer 420A in FIG. 4), and the antenna structure 250 may be fabricated on the metal layer 420A.

According to various embodiments, the antenna interposer 240 may include a molding layer, at least part of the antenna structure 310 being fabricated in the molding layer.

According to various embodiments, the antenna device of the electronic device 101 may include a wafer 210 having multiple first metal layers, an antenna interposer 240 disposed on a surface of the wafer and including multiple second metal layers, an RFIC 220 fabricated in at least part of the multiple first metal layers, an antenna structure 250 fabricated in at least part of the multiple second metal layers to have a first conductive pattern 440 with a first electrical length and a second conductive pattern 450 with a second electrical length, an antenna switch 230 fabricated in the RFIC 220 to have an end connected to the first conductive pattern 440 and the other end connected to the second conductive pattern 450 and electrically connected to at least one of the first conductive pattern 440 or the second conductive pattern based on a frequency band in which the RFIC 220 operates, and through holes (e.g., first TSV 315 and second TSV 325 in FIG. 3) for forming electrical connection paths between the wafer 210 and the antenna interposer 240.

According to various embodiments, the RFIC 220 may be fabricated in a front-end metal layer (e.g., front-end metal layer 410A in FIG. 4) or a back-end metal layer (e.g., back-end metal layer 410B in FIG. 4) among multiple first metal layers, and the antenna structure 250 may be fabricated in at least one of multiple second metal layers (e.g., metal layer 420A in FIG. 4) or a molding layer of the antenna interposer 240.

According to various embodiments, the electronic device or an antenna device of the electronic device may include an integrated antenna supporting multiple bands with a switch along with an RFIC that is implemented in an on-chip manner.

According to various embodiments, an RFIC including a switch and antennas are fully integrated into a multiband on-chip antenna so as to minimize a thickness and size of a structure (e.g., communication module or electronic device) for mounting a multi-band integrated antenna, which leads to advantages of small form factor (SSF) of the electronic device and improvement in signaling and power efficiency.

According to various embodiments, the multiband on-chip antenna implemented as a single antenna makes it possible for electronic devices designed to operate with smaller form factors for operation in various mmWave frequency bands to be universal with no operational boundaries between all countries. According to various embodiments, an antenna is implemented in an antenna interposer having an undoped passive structure, which is cost-saving in comparison with implementing an antenna in a wafer.

According to various embodiments, it may be possible to fabricate an antenna serving a purpose in an antenna interposer and form an antenna operating in a certain frequency band by means of a switch, resulting in support for multiband-based services. According to various embodiments, it may be possible to reduce signal loss and power loss, in comparison with conventional technologies, using packaging and bumps by miniaturizing the form factor and allowing signal exchange with the RFIC via silicon penetration electrodes (TSV) through a full integration process of the RFIC and antennas.

According to various embodiments, it may be possible to minimize silicon processing cost by further reducing a number of feed lines in such a way of integrating the feed lines necessary for multiple bands into a TSV. According to various embodiments, it may be possible to minimize a coupling impact between multiple bands by selecting a band using a switching implemented (designed) in the RFIC. For example, the inter-band coupling impact may be minimized by switching off (or opening) a switch for a second band while operating in a first band. According to various embodiments, it is advantageous for a fully integrated antenna to be applied to various internet of things (IoT) devices designed with small form factors.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a wafer;
   a radio frequency integrated circuit (RFIC) fabricated in the wafer;
   an antenna interposer disposed on a surface of the wafer;
   an antenna structure fabricated in the antenna interposer, the antenna structure comprising:
   a first conductive pattern with a first length, and
   a second conductive pattern with a second length;
   a switch formed in the RFIC and electrically connected to at least one of the first conductive pattern or the second conductive pattern based on a frequency band of a signal being transmitted or received by the RFIC; and
   a through hole formed in at least part of the wafer or the antenna interposer and electrically connecting the RFIC and the antenna structure.

2. The electronic device of claim 1, wherein the frequency band comprises a first frequency band or a second frequency band.

3. The electronic device of claim 2,
   wherein the first frequency band includes a 39 gigahertz (GHz) frequency, and
   wherein the second frequency band includes a 28 GHz frequency.

4. The electronic device of claim 2,
   wherein the first conductive pattern has a first length for the first frequency band, and
   wherein the second conductive pattern has a second length for the second frequency band.

5. The electronic device of claim 1, wherein the wafer and the antenna interposer are electrically connected through the through hole.

6. The electronic device of claim 1, wherein the through hole forms an electrical connection path by filling conductive materials in a hole disposed at a section in which a surface of the wafer and a surface of the antenna interposer face each other.

7. The electronic device of claim 1, wherein the through hole comprises:
   a first through hole formed between the RFIC and the antenna structure; and
   a second through hole formed between the switch and the antenna structure.

8. The electronic device of claim 1, wherein the through hole comprises a silicon penetration electrode of a through silicon via (TSV).

9. The electronic device of claim 1, wherein the through hole comprises a glass penetration electrode of a through glass via (TGV).

10. The electronic device of claim 1, wherein the antenna interposer comprises a silicon interposer.

11. The electronic device of claim 1, wherein the antenna interposer comprises a glass interposer.

12. The electronic device of claim 1, wherein the switch comprises a metal oxide semiconductor field effect transistor (MOSFET) switch.

13. The electronic device of claim 1, wherein the switch is included in the RFIC and is electrically connected to the antenna structure fabricated in the antenna interposer through the through hole.

14. The electronic device of claim 1, wherein the wafer comprises a plurality of metal layers including front-end metal layers or back-end metal layers.

15. The electronic device of claim 14, wherein the RFIC is fabricated in at least one of the front-end metal layers.

16. The electronic device of claim 14, wherein the RFIC is fabricated in at least one of the back-end metal layers.

17. The electronic device of claim 1,
   wherein the antenna interposer comprises at least one metal layer, and
   wherein the antenna structure is fabricated in the at least one metal layer.

18. The electronic device of claim 1,
   wherein the antenna interposer comprises a molding layer, and
   wherein at least part of the antenna structure is fabricated in the molding layer.

* * * * *